(12) United States Patent
Pan et al.

(10) Patent No.: US 11,280,866 B2
(45) Date of Patent: Mar. 22, 2022

(54) SYSTEM AND METHODS FOR T1 AND T2 WEIGHTED MAGNETIC RESONANCE IMAGING

(71) Applicant: UNIVERSITY OF PITTSBURGH—OF THE COMMONWEALTH SYSTEM OF HIGHER EDUCATION, Pittsburgh, PA (US)

(72) Inventors: Jullie W. Pan, Wexford, PA (US); Chan-Hong Moon, Pittsburgh, PA (US); Hoby Hetherington, Wexford, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 0 days.

(21) Appl. No.: 15/734,337

(22) PCT Filed: Jun. 13, 2019

(86) PCT No.: PCT/US2019/036874
§ 371 (c)(1),
(2) Date: Dec. 2, 2020

(87) PCT Pub. No.: WO2019/241459
PCT Pub. Date: Dec. 19, 2019

(65) Prior Publication Data
US 2021/0223345 A1    Jul. 22, 2021

Related U.S. Application Data

(60) Provisional application No. 62/685,366, filed on Jun. 15, 2018.

(51) Int. Cl.
*G01V 3/00* (2006.01)
*G01R 33/56* (2006.01)
(Continued)

(52) U.S. Cl.
CPC ..... *G01R 33/5602* (2013.01); *G01R 33/4822* (2013.01); *G01R 33/50* (2013.01); *G01R 33/5616* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 7,164,268 B2    1/2007  Mugler, III et al.
7,634,302 B2   12/2009  Gupta et al.
(Continued)

OTHER PUBLICATIONS

Schmitt et al. "Inversion recovery TrueFISP: quantification of T1, T2, and spin density." In: Magnetic Resonance in Medicine: An Official Journal of the International Society for Magnetic Resonance in Medicine. Mar. 26, 2004 (Mar. 26, 2004) Retrieved on Aug. 15, 2019 (Aug. 15, 2019) from <https://onlinelibrary.wiley.com/doi/pdf/10.1002/mrm.20058> entire document.

*Primary Examiner* — Walter L Lindsay Jr.
*Assistant Examiner* — Frederick Wenderoth
(74) *Attorney, Agent, or Firm* — Philip E. Levy; Eckert Seamans Cherin & Mellott, LLC

(57) ABSTRACT

A magnetic resonance imaging method includes performing an inversion pulse sequence using an MRI system, the inversion pulse sequence producing an inversion recovery period, and during the inversion recovery period: (i) performing a longitudinal T2 encoding pulse sequence using the MRI system; (ii) acquiring a post longitudinal T2 encoding pulse sequence image signal block immediately following the longitudinal T2 encoding pulse sequence using the MRI system; and (iii) acquiring an additional image signal block either before the longitudinal T2 encoding pulse sequence or following the acquiring of the post longitudinal T2 encoding pulse sequence image signal block using the (Continued)

MRI system. The method further include generating calculated image data based on at least the post longitudinal T2 encoding pulse sequence image signal block using a self-correcting normalization image combination scheme.

31 Claims, 7 Drawing Sheets

(51) Int. Cl.
*G01R 33/48* (2006.01)
*G01R 33/50* (2006.01)
*G01R 33/561* (2006.01)

(58) Field of Classification Search
USPC .......................................................... 324/309
See application file for complete search history.

(56) References Cited

U.S. PATENT DOCUMENTS

| | | |
|---|---|---|
| 9,063,206 B2 | 6/2015 | Madhuranthakam et al. |
| 2007/0255129 A1 | 11/2007 | Du et al. |
| 2009/0270719 A1 | 10/2009 | Miyoshi |
| 2010/0182008 A1 | 7/2010 | Tan et al. |
| 2013/0055222 A1 | 2/2013 | Darrow |

SYSTEM AND METHODS FOR T1 AND T2 WEIGHTED MAGNETIC RESONANCE IMAGING

CROSS-REFERENCE TO RELATED APPLICATIONS

This application is a U.S. National Stage Application under 35 U.S.C. § 371 of International Application No. PCT/US2019/036874, filed on Jun. 13, 2019, entitled "System and Methods for T2 And T2 Weighted Magnetic Resonance Imaging," which claims priority under 35 U.S.C. § 119(e) from U.S. Provisional Patent Application No. 62/685,366, filed on Jun. 15, 2018, entitled "System and Methods for T1 and T2 Weighted Magnetic Resonance Imaging", the disclosures of which are incorporated herein by reference.

GOVERNMENT CONTRACT

This invention was made with government support under grant #s NS090417, EB024408 and NS081772 awarded by the National Institutes of Health (NIH). The government has certain rights in the invention.

BACKGROUND OF THE INVENTION

1. Field of the Invention

The present invention relates to magnetic resonance imaging (MRI), and, in particular, to MRI methods, and a system implementing same, that generate T1 and T2 weighted images in a time and specific absorption rate (SAR) efficient manner, even at 7T.

2. Description of the Related Art

Magnetic resonance imaging (MRI) is a medical imaging technique used to form images of the anatomy of the body. MRI scanners or systems use strong magnetic fields, electric field gradients, and radio waves to generate images of the tissue and/or organs in the body. In particular, MRI is based on the magnetization properties of atomic nuclei. A powerful, uniform, external magnetic field is employed to align the protons that are normally randomly oriented within the water nuclei of the tissue being examined. This alignment is next perturbed by the introduction of external Radio Frequency (RF) energy. The nuclei return to their resting alignment through various relaxation processes and, in so doing, emit RF energy. After a certain period following the initial RF, the emitted signals are measured and used to create images.

Each tissue returns to its equilibrium state after excitation by the independent relaxation processes of T1 (spin-lattice; that is, magnetization in the same direction as the static magnetic field) and T2 (spin-spin; that is, magnetization transverse to the static magnetic field). For example, to create a T1-weighted image, magnetization is allowed to recover before measuring the emitted RF signals by changing the repetition time (TR). To create a T2-weighted image, magnetization is allowed to decay before measuring the emitted RF signals by changing the echo time (TE).

Fluid-attenuated inversion recovery (FLAIR) is an MRI sequence with an inversion recovery set to null fluids. For example, it can be used in brain imaging to suppress cerebrospinal fluid (CSF) effects on the image.

Currently there is not a good method by which T2 weighted and FLAIR imaging may be acquired at 7T. There are two groups of prior art methods which are available, both of which have known problems. The standard method is derived from 3T applications, and uses multiple (turbo) spin echo refocusing pulses to acquire multiple lines of data. At 7T, however, the high power demands of the transmit coil to generate the multiple refocusing pulses results in data acquisition being extremely slow because of limitations in the specific absorption rate (SAR), which is set by the CDRH (Centers for Devices and Radiological Health) and the FDA. The common method to minimize this effect is to reduce the refocusing angle; however this results in decreasing the image quality. For FLAIR imaging, this problem becomes more acute due to the need for multiple inversion pulses. The second, alternative method is the "variable flip angle" method. However, as several investigative groups have discussed, the variable flip angle strategy is very sensitive to RF homogeneity with the apparent T2 relaxation varying with k-space location. Additional approaches based on measured B1+ and parallel transmit design of individual k-space locations can mitigate this effect, however this significantly increases complexity in implementation. While several studies have found that the fast variable flip angle. TSE gives comparable images to conventional refocusing methods, the potential need to adjust parameters on a per-application basis will be time consuming. Thus, overall, for many 7T studies, the T2W and FLAIR methods are still performed with the 2-dimensional sequence, acquired with high in-plane resolution and thick slices (e.g., 0.4×0.4×3.5 mm3).

SUMMARY OF THE INVENTION

In one embodiment, an MRI system is used with a magnetic resonance imaging (MRI) method that includes performing an inversion pulse sequence followed by a recovery period, and during the recovery period: (i) performing a longitudinal T2 encoding pulse sequence; (ii) acquiring a post longitudinal T2 encoding pulse sequence image signal block immediately following the longitudinal T2 encoding pulse sequence; and (iii) acquiring an additional image signal block either before the longitudinal T2 encoding pulse sequence or following the acquiring of the post longitudinal T2 encoding pulse sequence image signal block. The method further includes generating calculated image data based on at least the post longitudinal T2 encoding pulse sequence image signal block using a self-correcting normalization image combination scheme.

In another embodiment, a magnetic resonance imaging system is provided that includes a magnet, an RF system, and a control system. The control system stores and is structured and configured to execute a number of routines, wherein the routines are structured and configured to perform an inversion pulse sequence using the RF system, the inversion pulse sequence producing an inversion recovery period, and during the inversion recovery period: (i) perform a longitudinal T2 encoding pulse sequence using the RF system; (ii) acquire a post longitudinal T2 encoding pulse sequence image signal block immediately following the longitudinal T2 encoding pulse sequence using the RF system; and (iii) acquire an additional image signal block either before the longitudinal T2 encoding pulse sequence or following the acquiring of the post longitudinal T2 encoding pulse sequence image signal block using the RF system. In addition, the routines are structured and configured to generate calculated image data based on at least the post longitudinal T2 encoding pulse sequence image signal block using a self-correcting normalization image combination scheme.

DETAILED DESCRIPTION OF EXEMPLARY EMBODIMENTS

Figure 1:
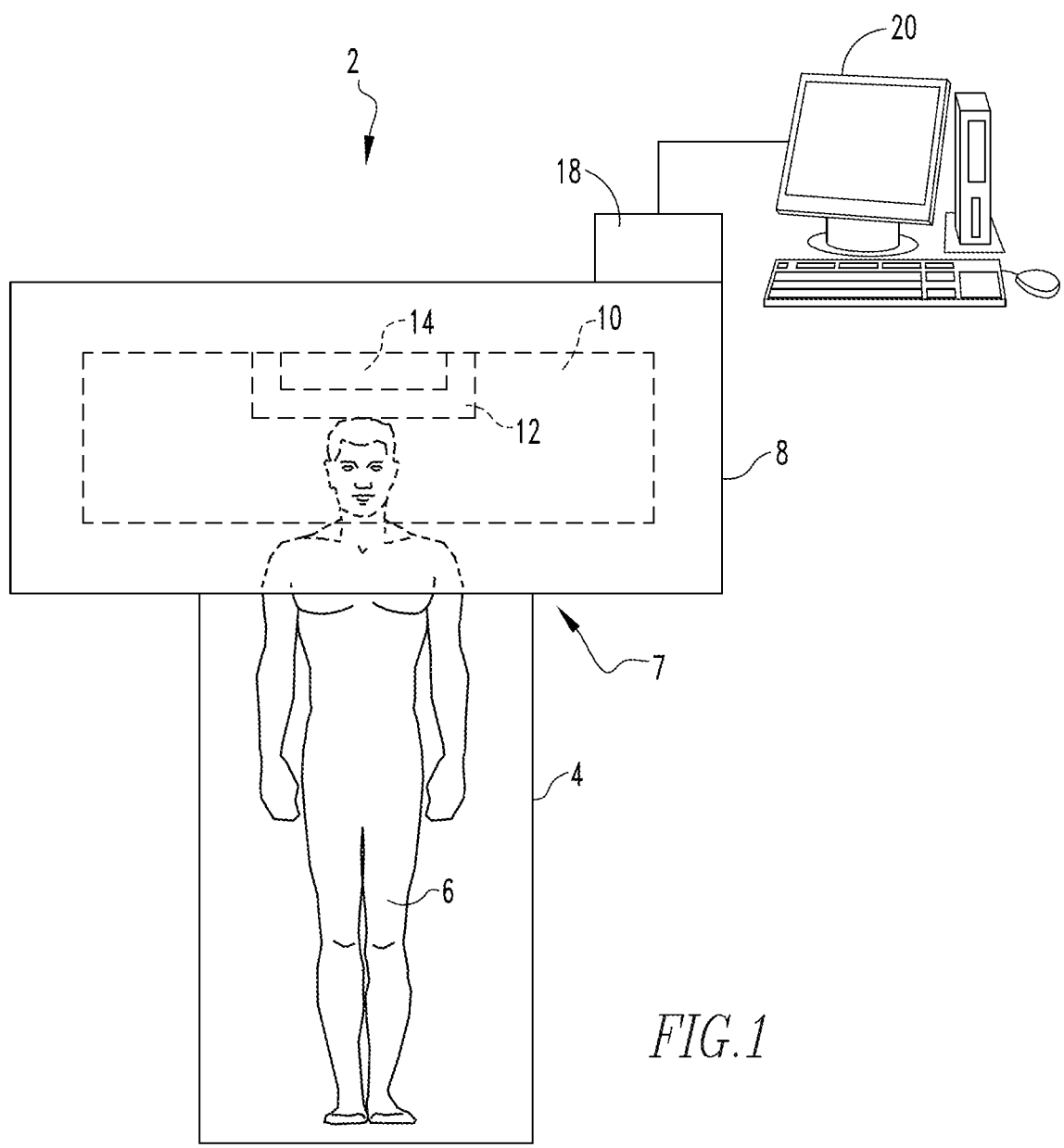
FIG. 1 is a schematic diagram of an MRI system according to an exemplary embodiment in which the various embodiments of the methods described herein may be implemented.

As used herein, the singular form of "a", "an", and "the" include plural references unless the context clearly dictates otherwise.

As used herein, the statement that two or more parts or components are "coupled" shall mean that the parts are joined or operate together either directly or indirectly, i.e., through one or more intermediate parts or components, so long as a link occurs.

As used herein, the term "number" shall mean one or an integer greater than one (i.e., a plurality).

As used herein, the term "inner product normalization (IPN) image combination" shall mean the combination of two MRI images using self-correcting normalization using the following:

$$R = \text{real}\left(\frac{S_1^* S_2}{|S_1|^2 + |S_2|^2}\right)$$

where $S_1$ and $S_2$ are the GRE signal at inversion recovery delays TI1 and TI2, respectively, and the "*" operator is a complex conjugator, as described in, for example, Marques J, Kober T, Krueger G, van der Zwaag W, Van de Moortele P, Gruetter R., "MP2RAGE, a self bias-field corrected sequence for improved segmentation and T1 mapping at high field", Neuroimage 2010 49:1271-81.

As used herein, the term "sign inverted inner product normalization (–IPN) image combination" shall mean an IPN image combination wherein in the equation of self-normalization, the "$S_1^* S_2$" term is replaced by "$-S1^* S2$".

As used herein, the term "spin echo pulse sequence" shall mean an MRI pulse sequence that includes a 90 degree RF pulse followed by one or more 180 degree refocusing RF pulses and optionally one or more additional 90 degree RF pulses.

As used herein, the term "inversion pulse sequence" shall mean an MRI pulse sequence used to invert the signal prior to a spin echo pulse sequence.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

The disclosed concept will now be described, for purposes of explanation, in connection with numerous specific details in order to provide a thorough understanding of the subject innovation. It will be evident, however, that the disclosed concept can be practiced without these specific details without departing from the spirit and scope of this innovation.

As described in greater detail herein, the disclosed concept provides a new MRI pulse sequence and associated methods to generate controlled T1 and T2 weighted images in an SAR efficient manner. Using a transceiver array, this sequence overcomes the SAR problems of existing methods to generate images with better than 0.7×0.7×1.2 mm resolution through integration of a T2 preparation spin echo into a multi-block inversion recovery sequence. With a self-correcting image combination strategy based on sign inverted inner product normalization (–IPN) image combination and/or inner product normalization (IPN) image combination, the acquisition scheme of the disclosed concept works to detect long T2 components while suppressing cerebral spinal fluid (CSF), which has been a problem for 7T imaging. The flexibility of the sequence of the disclosed concept permits quantitation of T1 and T2 which forms the basis for high efficiency imaging. The methods of the disclosed concept are referred to herein as magnetization prepared fluid attenuated inversion recovery gradient echo (MPFLAGRE).

FIG. 1 is a schematic diagram of an MRI system 2 according to an exemplary embodiment in which the various embodiments of the methods described herein may be implemented. In particular, the methods described herein, in the various embodiments, may be implemented as a number of software routines embedded in the control system of MRI system 2. Referring to FIG. 1, MRI system 2 includes a table 4 on which a patient 6 rests. Table 4 is structured to slide inside a tunnel 7 formed by a housing 8. Housing 8 houses a superconducting magnet 10, which generates a very high magnetic field. Housing 8 also houses a gradient coil 12. Gradient coil 12 is integrated with magnet 10 for adjusting the magnetic field. Housing 8 further houses a Radio Frequency (RF) assembly or system 14, which applies RF pulses to a specific body-part of the patient 6 to be analyzed, and receives signals that are returned by the same body-part. RF assembly or system 14 may be, for example, a surface coil system, a saddle coil system, a Helmholtz coil system, an RF transceiver array system, or any other suitable RF system or structure. A magnetic shield is provided, which surrounds magnet 10, gradient coil 12 and RF system 14, and which minimizes the magnetic fields generated within tunnel 7 from radiating outside the room in which MRI system 2 is located (the magnet shield usually encompasses the entire room). Magnetic shield also protects the inside of tunnel 7 from external magnetic interferences.

MRI system 2 also includes a control module 18 that includes all the components that are required to drive gradient coil system 12 and RF system 14 (for example, an RF transmitter, an output amplifier, and the like); control module 18 also includes all the components that are required to acquire the response signals from the body-part (for example, an input amplifier, an Analog-To-Digital Converter, or ADC, and the like). Moreover, control module 18 drives an optional motor (not shown) that is used to move the table 4 to and from tunnel 7. Finally, control module 18 includes a processing portion which may be, for example, a microprocessor, a microcontroller or some other suitable processing device, and a memory portion that may be internal to the processing portion or operatively coupled to the processing portion and that provides a storage medium for data and software executable by the processing portion for controlling the operation of MRI system 2, including the routines for implementing the various embodiments of the method described herein.

MRI system 2 further includes a computer system 20 (for example, a Personal Computer, or PC), which is coupled to control module 18. Computer system 20 is configured to control MRI system 2 and to post-process the acquired response signals. Computer system 20 is also configured to display images relating to the body-part under analysis. In an alternative embodiment, one or more of the routines for implementing the various embodiments of the method described herein may be implemented in and by computer system 20.

Figure 2:
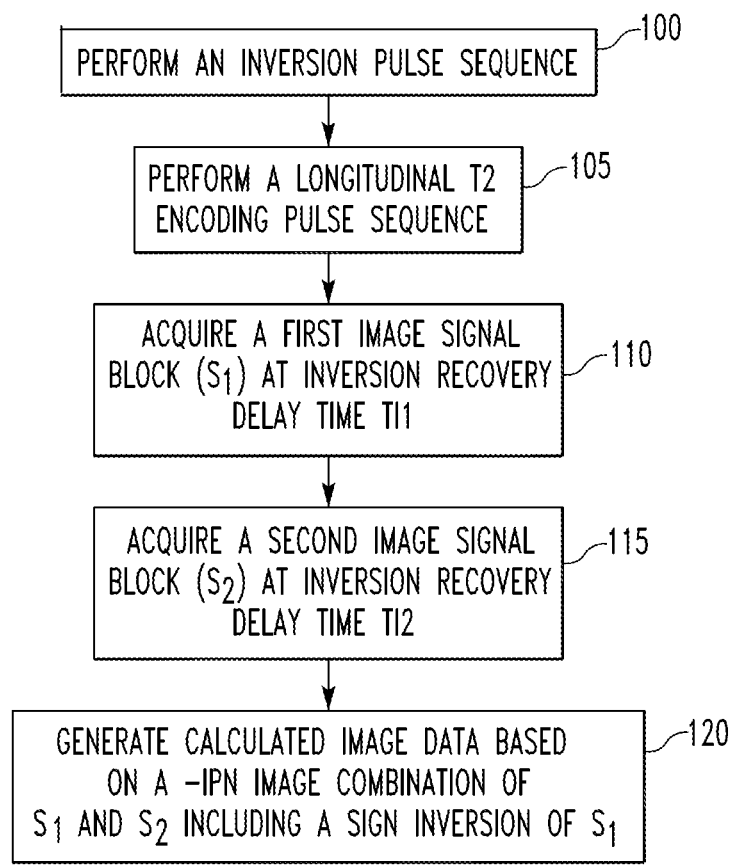
FIG. 2 is a flowchart showing a method of generating T1 and T2 weighted magnetic resonance imaging data according to a first exemplary embodiment of the disclosed concept.

FIG. 2 is a flowchart showing a method of generating T1 and T2 weighted magnetic resonance imaging data according to a first exemplary embodiment of the disclosed concept. The embodiment shown in FIG. 2 is referred to as MPFLAGRE-2 herein because it involves the acquisition of two image signal blocks following a longitudinal T2 encoding pulse sequence. For illustrative purposes, the method will be described in connection with the exemplary MRI system 2 shown in FIG. 1, although it will be appreciated that other implementations and configurations are possible within the scope of the disclosed concept.

Referring to FIG. 2, the method begins at step 100, wherein an inversion pulse sequence is performed by MRI system 2. Next, at step 105, a longitudinal T2 encoding pulse sequence is performed by MRI system 2. In the exemplary embodiment, the longitudinal T2 encoding pulse sequence of step 105 is a spin echo pulse sequence. In one particular implementation, the spin echo pulse sequence is a nonselective spin echo pulse sequence of duration TE comprising the following format: 90x+−180−180−90x−. After step 105, the method proceeds to step 110. At step 110, MRI system 2 acquires a first image signal block ($S_1$) at inversion recovery delay time TI1. Then, at step 115, MRI system 2 acquires a second image signal block ($S_2$) at inversion recovery delay time TI2. In the exemplary embodiment, $S_1$ and $S_2$ are each a 3D gradient recalled echo (GRE) readout block. Then, at step 120, MRI system 2 generates calculated image data based on an −IPN image combination of $S_1$ and $S_2$ including a sign inversion of $S_1$. Specifically, the calculated image data is $R_{1/2}$, with $R_{1/2}$ being calculated based on the following:

$$R_{1/2} = \text{real}\left(\frac{-S_1^* S_2}{|S_1|^2 + |S_2|^2}\right).$$

Figure 3:
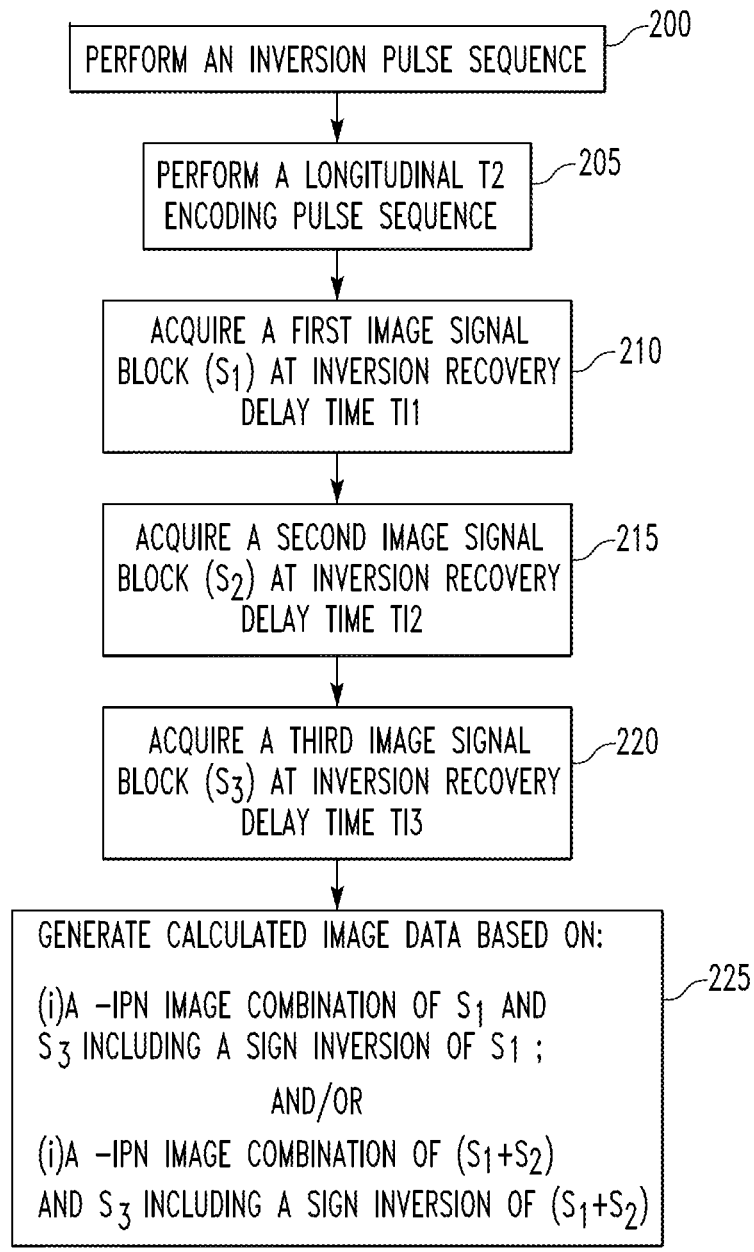
FIG. 3 is a flowchart showing a method of generating T1 and T2 weighted magnetic resonance imaging data according to a second exemplary embodiment of the disclosed concept.

FIG. 3 is a flowchart showing a method of generating T1 and T2 weighted magnetic resonance imaging data according to a second exemplary embodiment of the disclosed concept. The embodiment shown in FIG. 3 is referred to as MPFLAGRE-3 herein because it involves the acquisition of three image signal blocks following a longitudinal T2 encoding pulse sequence. For illustrative purposes, the method will be described in connection with the exemplary MRI system 2 shown in FIG. 1, although it will be appreciated that other implementations and configurations are possible within the scope of the disclosed concept.

Referring to FIG. 3, the method begins at step 200, wherein an inversion pulse sequence is performed by MRI system 2. Next, at step 205, a longitudinal T2 encoding pulse sequence as described herein is performed by MRI system 2. After step 205, the method proceeds to step 210. At step 210, MRI system 2 acquires a first image signal block ($S_1$) at inversion recovery delay time TI1. Then, at step 215, MRI system 2 acquires a second image signal block ($S_2$) at inversion recovery delay time TI2, and at step 220, MRI system 2 acquires a third image signal block ($S_3$) at inversion recovery delay time TI3. In the exemplary embodiment, $S_1$, $S_2$ and $S_3$ are each a 3D gradient recalled echo (GRE) readout block. Then, at step 225, MRI system 2 generates calculated image data based on: (i) a −IPN image combination of $S_1$ and $S_3$ including a sign inversion of $S_1$, wherein the calculated image data is $R_{1/3}$, with $R_{1/3}$ being calculated based on the following:

$$R_{1/3} = \text{real}\left(\frac{-S_1^* S_3}{|S_1|^2 + |S_3|^2}\right),$$

and/or (ii) a −IPN image combination of ($S_1+S_2$) and $S_3$ including a sign inversion of ($S_1+S_2$), wherein the calculated image data is $R_{(1+2)/3}$, with $R_{(1+2)/3}$ being calculated based on the following:

$$R_{(1+2)/3} = \text{real}\left(\frac{-(S_1 + S_2)^* S_3}{|S_1 + S_2|^2 + |S_3|^2}\right).$$

Figure 4:
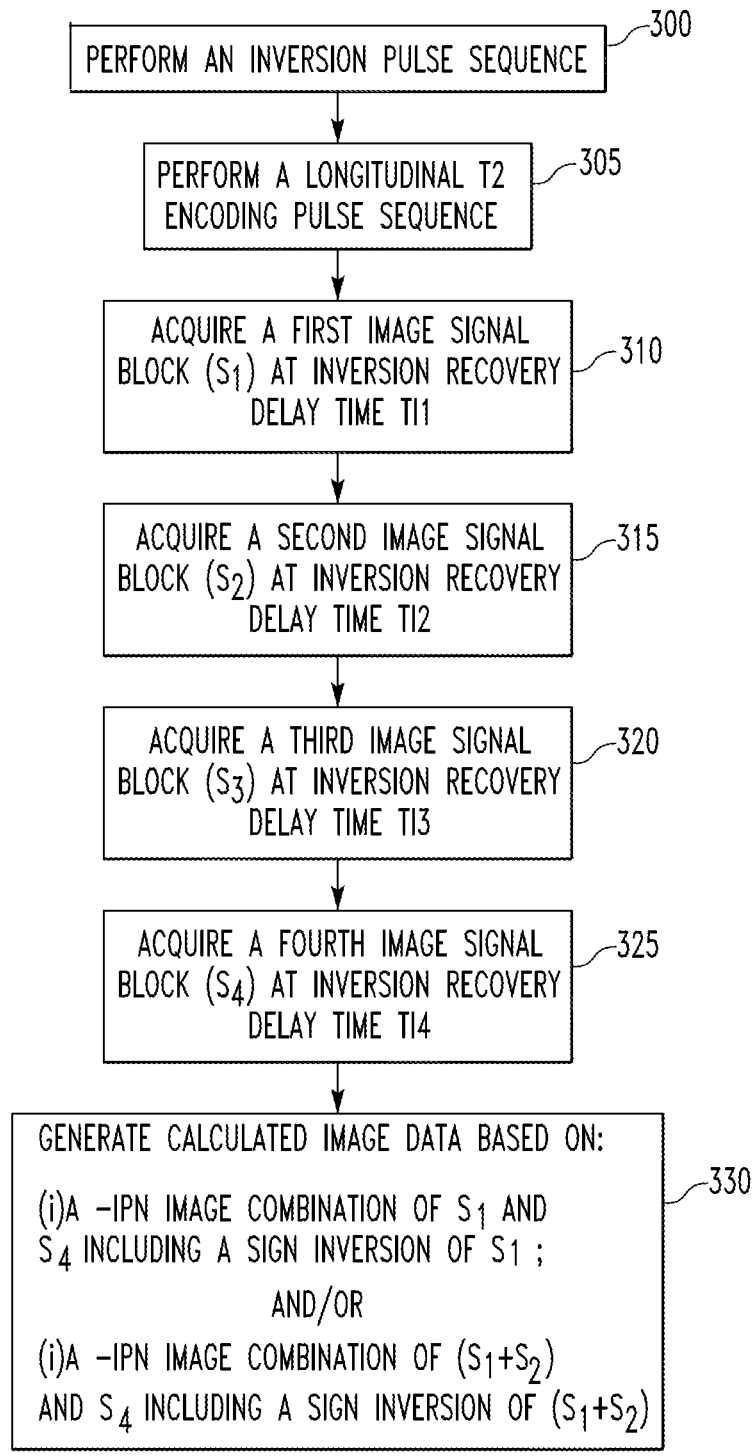
FIG. 4 is a flowchart showing a method of generating T1 and T2 weighted magnetic resonance imaging data according to a third exemplary embodiment of the disclosed concept.

FIG. 4 is a flowchart showing a method of generating T1 and T2 weighted magnetic resonance imaging data according to a third exemplary embodiment of the disclosed concept. The embodiment shown in FIG. 4 is referred to as MPFLAGRE-4 herein because it involves the acquisition of four image signal blocks following a longitudinal T2 encoding pulse sequence. For illustrative purposes, the method will be described in connection with the exemplary MRI system 2 shown in FIG. 1, although it will be appreciated that other implementations and configurations are possible within the scope of the disclosed concept Referring to FIG. 4, the method begins at step 300, wherein an inversion pulse sequence is performed by MRI system 2. Next, at step 305, a longitudinal T2 encoding pulse sequence as described herein is performed by MRI system 2. After step 305, the method proceeds to step 310. At step 310, MRI system 2 acquires a first image signal block ($S_1$) at inversion recovery delay time TI1. Then, at step 315, MRI system 2 acquires a second image signal block ($S_2$) at inversion recovery delay time TI2, at step 320, MRI system 2 acquires a third image signal block ($S_3$) at inversion recovery delay time TI3, and at step 325, MRI system 2 acquires a fourth image signal block ($S_4$) at inversion recovery delay time TI4. In the exemplary embodiment, $S_1$, $S_2$, $S_3$ and $S_4$ are each a 3D gradient recalled echo (GRE) readout block. Then, at step 330, MRI system 2 generates calculated image data based on: (i) a −IPN image combination of $S_1$ and $S_4$ including a sign inversion of $S_1$, wherein the calculated image data is $R_{1/4}$, with $R_{1/4}$ being calculated based on the following:

$$R_{1/4} = \text{real}\left(\frac{-S_1^* S_4}{|S_1|^2 + |S_4|^2}\right),$$

and/or (ii) a −IPN image combination of $(S_1+S_2)$ and $S_4$ including a sign inversion of $(S_1+S_2)$, wherein the calculated image data is $R_{(1+2)/4}$, with $R_{(1+2)/4}$ being calculated based on the following:

$$R_{(1+2)/4} = \text{real}\left(\frac{-(S_1 + S_2)^* S_4}{|S_1 + S_2|^2 + |S_4|^2}\right).$$

In this exemplary embodiment, MRI system 2 may also simultaneously generate Ru; and $R_{(1+2)/3}$ as described above.

Figure 5:
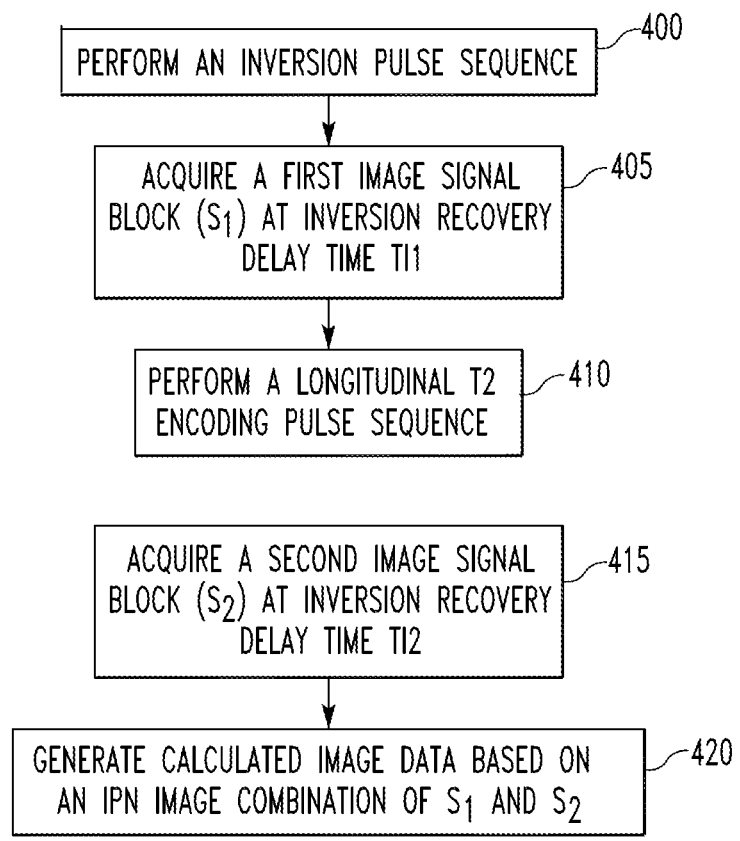
FIG. 5 is a flowchart showing a method of generating T1 and T2 weighted magnetic resonance imaging data according to a fourth exemplary embodiment of the disclosed concept.

FIG. 5 is a flowchart showing a method of generating T1 and T2 weighted magnetic resonance imaging data according to a fourth exemplary embodiment of the disclosed concept. The embodiment shown in FIG. 5 is referred to as MPFLAGRE-2L herein because it involves the acquisition of two blocks with the longitudinal T2 encoding pulse sequence applied late in the inversion recovery. For illustrative purposes, the method will be described in connection with the exemplary MRI system 2 shown in FIG. 1, although it will be appreciated that other implementations and configurations are possible within the scope of the disclosed concept.

Referring to FIG. 5, the method begins at step 400, wherein an inversion pulse sequence is performed by MRI system 2. Next, at step 405, MRI system 2 acquires a first image signal block ($S_1$) at inversion recovery delay time TI1. Next, at step 410, a longitudinal T2 encoding pulse sequence as described herein is performed by MRI system 2. After step 410, the method proceeds to step 415. Then, at step 415, MRI system 2 acquires a second image signal block ($S_2$) at inversion recovery delay time TI2. In the exemplary embodiment, $S_1$ and $S_2$ are each a 3D gradient recalled echo (GRE) readout block. Then, at step 420, MRI system 2 generates calculated image data based on the inner product normalization of $S_1$ and $S_2$, wherein the calculated image data is $R_{1/2}$, and wherein $R_{1/2}$ is calculated based on the following:

$$R_{1/2} = \text{real}\left(\frac{-S_1^* S_2}{|S_1|^2 + |S_2|^2}\right).$$

Figure 6:
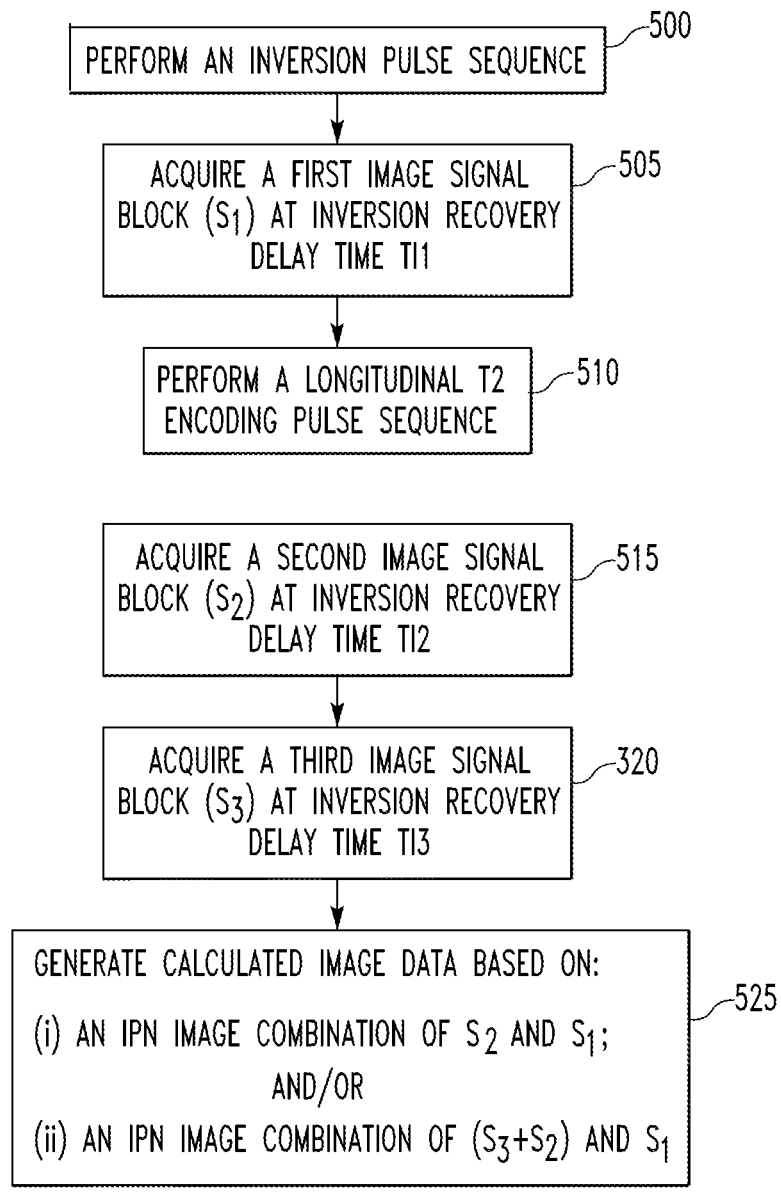
FIG. 6 is a flowchart showing a method of generating T1 and T2 weighted magnetic resonance imaging data according to a fifth exemplary embodiment of the disclosed concept.

FIG. 6 is a flowchart showing a method of generating T1 and T2 weighted magnetic resonance imaging data according to a fifth exemplary embodiment of the disclosed concept. The embodiment shown in FIG. 6 is referred to as MPFLAGRE-3L herein because it involves the acquisition of three image signal blocks, with the T2 encoding module applied late in the inversion recovery. For illustrative purposes, the method will be described in connection with the exemplary MRI system 2 shown in FIG. 1, although it will be appreciated that other implementations and configurations are possible within the scope of the disclosed concept.

Referring to FIG. 6, the method begins at step 500, wherein an inversion pulse sequence is performed by MRI system 2. Next, at step 505, MRI system 2 acquires a first image signal block ($S_1$) at inversion recovery delay time TI1. Next, at step 510, a longitudinal T2 encoding pulse sequence as described herein is performed by MRI system 2. After step 510, the method proceeds to step 515. Then, at step 515, MRI system 2 acquires a second image signal block ($S_2$) at inversion recovery delay time TI2, and then at step 520, MRI system 2 acquires a third image signal block ($S_3$) at inversion recovery delay time TI3. In the exemplary embodiment, $S_1$, $S_2$ and $S_3$ are each a 3D gradient recalled echo (GRE) readout block. Then, at step 525, MRI system 2 generates calculated image data based on the inner product normalization combination of $S_2$ and $S_1$, wherein the calculated image data is $R_{2/1}$, and wherein $R_{2/1}$ is calculated based on the following:

$$R_{2/1} = \text{real}\left(\frac{S_2^* S_1}{|S_2|^2 + |S_1|^2}\right),$$

and/or (ii) an inner product normalization combination of $(S_3+S_2)$ and $S_1$ wherein the calculated image data is $R_{(3+2)/1}$, and wherein $R_{(3+2)/1}$ is calculated based on the following:

$$R_{(3+2)/1} = \text{real}\left(\frac{(S_3 + S_2)^* S_1}{|S_3 + S_2|^2 + |S_1|^2}\right).$$

Figure 7:
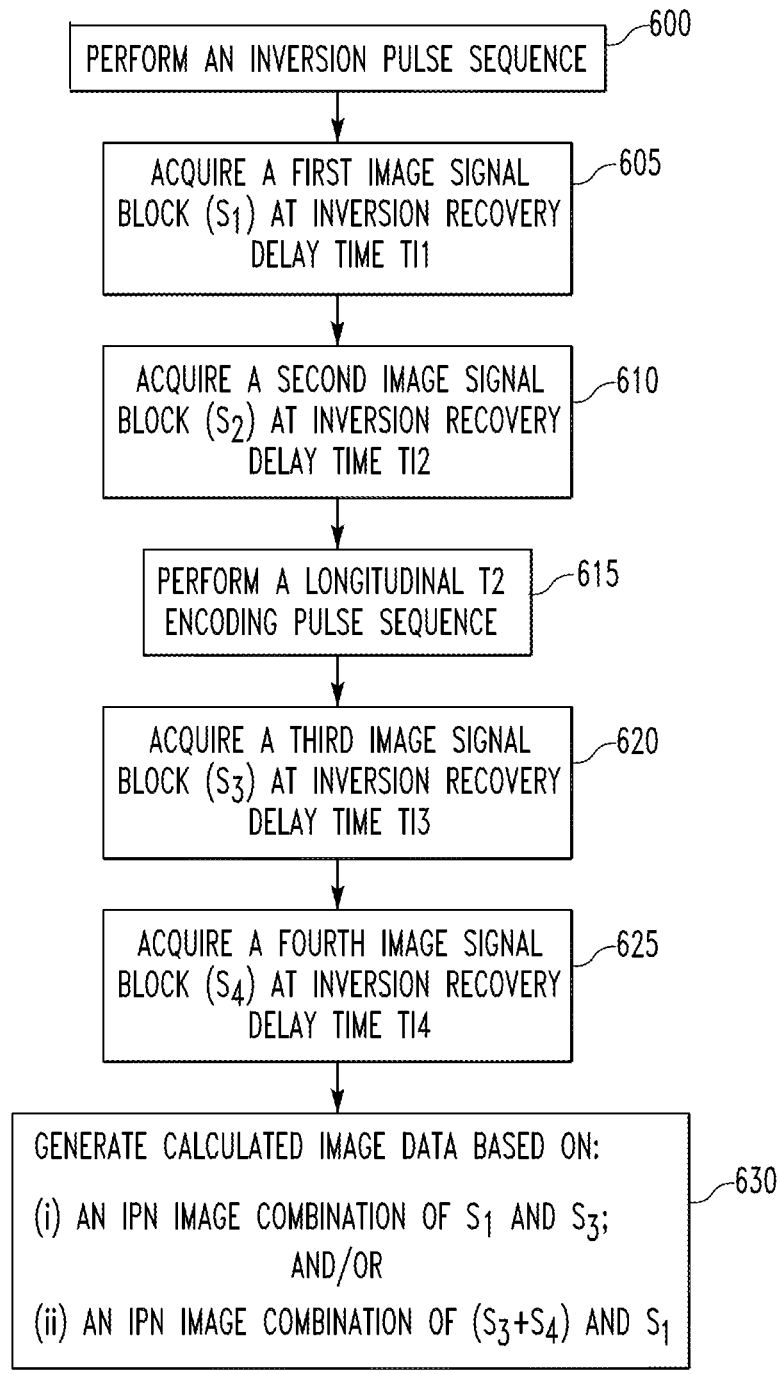
FIG. 7 is a flowchart showing a method of generating T1 and T2 weighted magnetic resonance imaging data according to a sixth exemplary embodiment of the disclosed concept.

FIG. 7 is a flowchart showing a method of generating T1 and T2 weighted magnetic resonance imaging data according to a sixth exemplary embodiment of the disclosed concept. The embodiment shown in FIG. 7 is referred to as MPFLAGRE-4L herein because it involves the acquisition of four image signal blocks with the longitudinal T2 encoding pulse sequence applied late after the inversion. For illustrative purposes, the method will be described in connection with the exemplary MRI system 2 shown in FIG. 1, although it will be appreciated that other implementations and configurations are possible within the scope of the disclosed concept.

Referring to FIG. 7, the method begins at step 600, wherein an inversion pulse sequence is performed by MRI system 2. Next, at step 605, MRI system 2 acquires a first image signal block ($S_1$) at inversion recovery delay time TI1. At step 610, MRI system 2 acquires a second image signal block ($S_2$) at inversion recovery delay time TI2. Then, at step 615, a longitudinal T2 encoding pulse sequence as described herein is performed by MRI system 2. After step 615, the method proceeds to step 620. At step 620, MRI system 2 acquires image signal block ($S_3$) at inversion recovery delay time TI3. Then, at step 625, MRI system 2 acquires a fourth image signal block ($S_4$) at inversion recovery delay time TI4. In the exemplary embodiment, $S_1$, $S_2$, $S_3$ and $S_4$ are each a 3D gradient recalled echo (GRE) readout block. Then, at step 630, MRI system 2 generates calculated image data based on: (i) an IPN image combination of $S_1$ and $S_3$ wherein the calculated image data is $R_{3/1}$, and wherein $R_{3/1}$ is calculated based on the following:

$$R_{3/1} = \text{real}\left(\frac{S_3^* S_1}{|S_3|^2 + |S_1|^2}\right),$$

and/or (ii) an IPN image combination of $(S_3+S_4)$ and $S_1$ wherein the calculated image data is $R_{(3+4)/1}$, and wherein $R_{(3+4)/1}$ is calculated based on the following:

$$R_{(3+4)/1} = \text{real}\left(\frac{(S_3+S_4)^* S_1}{|S_3+S_4|^2 + |S_1|^2}\right).$$

In this exemplary embodiment, MRI system 2 may also simultaneously generate $R_{3/1}$ and $R_{(3+2)/1}$ as described above.

While the exemplary methods described herein include performing only a single longitudinal T2 encoding pulse sequence during the inversion recovery period, it will be appreciated that multiple longitudinal T2 encoding pulse sequences may also be employed within the scope of the disclosed concept.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A magnetic resonance imaging (MRI) method, comprising:
    performing an inversion pulse sequence using an MRI system, the inversion pulse sequence producing an inversion recovery period;
    during the inversion recovery period:
        (i) performing a longitudinal T2 encoding pulse sequence using the MRI system;
        (ii) acquiring a post longitudinal T2 encoding pulse sequence image signal block immediately following the longitudinal T2 encoding pulse sequence using the MRI system; and
        (iii) acquiring an additional image signal block either before the longitudinal T2 encoding pulse sequence or following the acquiring of the post longitudinal T2 encoding pulse sequence image signal block using the MRI system; and
    generating calculated image data based on at least the post longitudinal T2 encoding pulse sequence image signal block using a self-correcting normalization image combination scheme.

2. A magnetic resonance imaging (MRI) system, comprising:
    a magnet;
    an RF system; and
    a control system, wherein the control system stores and is structured and configured to execute a number of routines, the number of routines being structured and configured to:
        perform an inversion pulse sequence using the RF system, the inversion pulse sequence producing an inversion recovery period;
        during the inversion recovery period:
            (i) perform a longitudinal T2 encoding pulse sequence using the RF system;
            (ii) acquire a post longitudinal T2 encoding pulse sequence image signal block immediately following the longitudinal T2 encoding pulse sequence using the RF system; and
            (iii) acquire an additional image signal block either before the longitudinal T2 encoding pulse sequence or following the acquiring of the post longitudinal T2 encoding pulse sequence image signal block using the RF system; and
        generate calculated image data based on at least the post longitudinal T2 encoding pulse sequence image signal block using a self-correcting normalization image combination scheme.

3. The method according to claim 1, wherein the self-correcting normalization image combination scheme includes an inner product normalization image combination or a sign inverted inner product normalization image combination.

4. The method according to claim 1, wherein the post longitudinal T2 encoding pulse sequence image signal block and the additional image signal block are each a 3D gradient recalled echo (GRE) readout block.

5. The method according to claim 1, wherein the longitudinal T2 encoding pulse sequence is a spin echo pulse sequence.

6. The method according to claim 5, wherein the spin echo pulse sequence is a non-selective spin echo pulse sequence of duration TE comprising the following format: 90x+−180−180−90x−.

7. The method according to claim 1, the post longitudinal T2 encoding pulse sequence image signal block is designated $S_1$ and the additional image signal block is designated $S_2$, wherein (i), (ii) and (iii) comprise performing the longitudinal T2 encoding pulse sequence immediately following the inversion pulse sequence, acquiring $S_1$ immediately following the longitudinal T2 encoding pulse sequence, and acquiring $S_2$ following the acquiring of $S_1$.

8. The method according to claim 7, wherein the generating the calculated image data is based on a sign inverted inner product normalization image combination of $S_1$ and $S_2$ including a sign inversion of $S_1$, wherein the calculated image data is $R_{1/2}$, and wherein $R_{1/2}$ is calculated based on the following:

$$R_{1/2} = \text{real}\left(\frac{-S_1^* S_2}{|S_1|^2 + |S_2|^2}\right).$$

9. The method according to claim 7, further comprising acquiring a third image signal block ($S_3$) following the acquiring of $S_2$ using the MRI system, wherein the generating the calculated image data is based on a sign inverted inner product normalization image combination of $S_1$ and $S_3$ including a sign inversion of $S_1$, wherein the calculated image data is $R_{1/3}$, and wherein $R_{1/3}$ is calculated based on the following:

$$R_{1/3} = \text{real}\left(\frac{-S_1^* S_3}{|S_1|^2 + |S_3|^2}\right).$$

10. The method according to claim 7, further comprising acquiring a third image signal block ($S_3$) following the acquiring of $S_2$ using the MRI system and acquiring a fourth image signal block ($S_4$) following the acquiring of $S_3$ using the MRI system, wherein the generating the calculated image data is based on a sign inverted inner product normalization image combination of $S_1$ and $S_4$ including a sign inversion of $S_1$, wherein the calculated image data is $R_{1/4}$, and wherein $R_{1/4}$ is calculated based on the following:

$$R_{1/4} = \text{real}\left(\frac{-S_1^* S_4}{|S_1|^2 + |S_4|^2}\right).$$

11. The method according to claim 7, further comprising acquiring a third image signal block ($S_3$) following the acquiring of $S_2$ using the MRI system, wherein the generating the calculated image data is based on a sign inverted inner product normalization image combination of ($S_1+S_2$) and $S_3$ including a sign inversion of ($S_1+S_2$), wherein the calculated image data is $R_{(1+2)/3}$, and wherein $R_{(1+2)/3}$ is calculated based on the following:

$$R_{(1+2)/3} = \text{real}\left(\frac{-(S_1+S_2)^* S_3}{|S_1+S_2|^2 + |S_3|^2}\right).$$

12. The method according to claim 7, further comprising acquiring a third image signal block ($S_3$) following the acquiring of $S_2$ using the MRI system and acquiring a fourth image signal block ($S_4$) following the acquiring of $S_3$ using the MRI system, wherein the generating the calculated image data is based on a sign inverted inner product normalization image combination of ($S_1+S_2$) and $S_4$ including a sign inversion of ($S_1+S_2$), wherein the calculated image data is $R_{(1+2)/4}$, and wherein $R_{(1+2)/4}$ is calculated based on the following:

$$R_{(1+2)/4} = \text{real}\left(\frac{-(S_1+S_2)^* S_4}{|S_1+S_2|^2 + |S_4|^2}\right).$$

13. The method according to claim 1, wherein the additional image signal block is designated $S_1$ and the post longitudinal T2 encoding pulse sequence image signal block is designated $S_2$, wherein (i), (ii) and (iii) comprise acquiring $S_1$ before performing the longitudinal T2 encoding pulse sequence, and acquiring $S_2$ immediately following the longitudinal T2 encoding pulse sequence.

14. The method according to claim 13, wherein the generating the calculated image data is based on an inner product normalization image combination of $S_1$ and $S_2$, wherein the calculated image data is $R_{1/2}$, and wherein $R_{1/2}$ is calculated based on the following:

$$R_{1/2} = \text{real}\left(\frac{S_1^* S_2}{|S_1|^2 + |S_2|^2}\right).$$

15. The method according to claim 13, further comprising acquiring a third image signal block ($S_3$) following the acquiring of $S_2$ using the MRI system, wherein the generating the calculated image data is based on an inner product normalization image combination of $S_2$ and $S_1$, wherein the calculated image data is $R_{2/1}$, and wherein $R_{2/1}$ is calculated based on the following:

$$R_{2/1} = \text{real}\left(\frac{S_2^* S_1}{|S_2|^2 + |S_1|^2}\right),$$

and/or
wherein the generating the calculated image data is based on an inner product normalization image combination of ($S_3+S_2$) and $S_1$ wherein the calculated image data is $R_{(3+2)/1}$, and wherein $R_{(3+2)/1}$ is calculated based on the following:

$$R_{(3+2)/1} = \text{real}\left(\frac{(S_3+S_2)*S_1}{|S_3+S_2|^2 + |S_1|^2}\right).$$

16. The method according to claim 13, further comprising acquiring a third image signal block ($S_3$) following the acquiring of $S_2$ using the MRI system and acquiring a fourth image signal block ($S_4$) following the acquiring of $S_3$ using the MRI system, wherein the generating the calculated image data is based on an inner product normalization image combination of $S_1$ and $S_3$ wherein the calculated image data is $R_{3/1}$, and wherein $R_{3/1}$ is calculated based on the following:

$$R_{3/1} = \text{real}\left(\frac{S_3^* S_1}{|S_3|^2 + |S_1|^2}\right),$$

and/or
wherein the generating the calculated image data is based on an IPN image combination of ($S_3+S_4$) and $S_1$ wherein the calculated image data is $R_{(3+4)/1}$, and wherein $R_{(3+4)/1}$ is calculated based on the following:

$$R_{(3+4)/1} = \text{real}\left(\frac{(S_3+S_4)*S_1}{|S_3+S_4|^2 + |S_1|^2}\right).$$

17. A non-transitory computer readable medium storing one or more programs, including instructions, which when executed by a computer, causes the computer to perform the method of claim 1.

18. The MRI system according to claim 2, wherein the self-correcting normalization image combination scheme includes an inner product normalization image combination or a sign inverted inner product normalization image combination.

19. The MRI system according to claim 2, wherein the post longitudinal T2 encoding pulse sequence image signal block and the additional image signal block are each a 3D gradient recalled echo (GRE) readout block.

20. The MRI system according to claim 2, wherein the longitudinal T2 encoding pulse sequence is a spin echo pulse sequence.

21. The MRI system according to claim 2, wherein the spin echo pulse sequence is a non-selective spin echo pulse sequence of duration TE comprising the following format: 90x+−180−180−90x−.

22. The MRI system according to claim 2, the post longitudinal T2 encoding pulse sequence image signal block is designated $S_1$ and the additional image signal block is designated $S_2$, wherein (i), (ii) and (iii) comprise performing the longitudinal T2 encoding pulse sequence immediately following the inversion pulse sequence, acquiring $S_1$ immediately following the longitudinal T2 encoding pulse sequence, and acquiring $S_2$ following the acquiring of $S_1$.

23. The MRI system according to claim 22, wherein the calculated image data is generated based on a sign inverted inner product normalization image combination of $S_1$ and $S_2$ including a sign inversion of $S_1$, wherein the calculated image data is $R_{1/2}$, and wherein $R_{1/2}$ is calculated based on the following:

$$R_{1/2} = \text{real}\left(\frac{-S_1^* S_2}{|S_1|^2 + |S_2|^2}\right).$$

24. The MRI system according to claim 22, the number of routines being further structured and configured to acquire a third image signal block ($S_3$) following the acquiring of $S_2$ using the RF system, wherein the generating the calculated image data is based on a sign inverted inner product normalization image combination of $S_1$ and $S_3$ including a sign inversion of $S_1$, wherein the calculated image data is $R_{1/3}$, and wherein $R_{1/3}$ is calculated based on the following:

$$R_{1/3} = \text{real}\left(\frac{-S_1^* S_3}{|S_1|^2 + |S_3|^2}\right).$$

25. The MRI system according to claim 22, the number of routines being further structured and configured to acquire a third image signal block ($S_3$) following the acquiring of $S_2$ using the RF system and acquire a fourth image signal block ($S_4$) following the acquiring of $S_3$ using the RF system, wherein the calculated image data is generated based on a sign inverted inner product normalization image combination of $S_1$ and $S_4$ including a sign inversion of $S_1$, wherein the calculated image data is $R_{1/4}$, and wherein $R_{1/4}$ is calculated based on the following:

$$R_{1/4} = \text{real}\left(\frac{-S_1^* S_4}{|S_1|^2 + |S_4|^2}\right).$$

26. The MRI system according to claim 22, the number of routines being further structured and configured to acquire a third image signal block ($S_3$) following the acquiring of $S_2$ using the RF system, wherein the calculated image data is generated based on a sign inverted inner product normalization image combination of ($S_1+S_2$) and $S_3$ including a sign inversion of ($S_1+S_2$), wherein the calculated image data is $R_{(1+2)/3}$, and wherein $R_{(1+2)/3}$ is calculated based on the following:

$$R_{(1+2)/3} = \text{real}\left(\frac{-(S_1+S_2)*S_3}{|S_1+S_2|^2 + |S_3|^2}\right).$$

27. The MRI system according to claim 22, the number of routines being further structured and configured to acquire a third image signal block ($S_3$) following the acquiring of $S_2$ using the RF system and acquire a fourth image signal block ($S_4$) following the acquiring of $S_3$ using the RF system, wherein the calculated image data is generated based on a sign inverted inner product normalization image combination of ($S_1+S_2$) and $S_4$ including a sign inversion of ($S_1+S_2$), wherein the calculated image data is $R_{(1+2)/4}$, and wherein $R_{(1+2)/4}$ is calculated based on the following:

$$R_{(1+2)/4} = \text{real}\left(\frac{-(S_1+S_2)*S_4}{|S_1+S_2|^2 + |S_4|^2}\right).$$

28. The MRI system according to claim 2, wherein the additional image signal block is designated $S_1$ and the post longitudinal T2 encoding pulse sequence image signal block is designated $S_2$, wherein (i), (ii) and (iii) comprise acquiring $S_1$ before performing the longitudinal T2 encoding pulse sequence, and acquiring $S_2$ immediately following the longitudinal T2 encoding pulse sequence.

29. The MRI system according to claim 28, wherein the generating the calculated image data is based on an inner product normalization image combination of $S_1$ and $S_2$, wherein the calculated image data is $R_{1/2}$, and wherein $R_{1/2}$ is calculated based on the following:

$$R_{1/2} = \text{real}\left(\frac{S_1^* S_2}{|S_1|^2 + |S_2|^2}\right).$$

30. The MRI system according to claim 28, the number of routines being further structured and configured to acquire a third image signal block ($S_3$) following the acquiring of $S_2$ using the MRI system, wherein the generating the calculated image data is based on an inner product normalization image combination of $S_2$ and $S_1$, wherein the calculated image data is $R_{2/1}$, and wherein $R_{2/1}$ is calculated based on the following:

$$R_{2/1} = \text{real}\left(\frac{S_2^* S_1}{|S_2|^2 + |S_1|^2}\right),$$

and/or
wherein the generating the calculated image data is based on an inner product normalization image combination of ($S_3+S_2$) and $S_1$ wherein the calculated image data is $R_{(3+2)/1}$, and wherein $R_{(3+2)/1}$ is calculated based on the following:

$$R_{(3+2)/1} = \text{real}\left(\frac{(S_3+S_2)*S_1}{|S_3+S_2|^2 + |S_1|^2}\right).$$

31. The MRI system according to claim 28, the number of routines being further structured and configured to acquire a third image signal block ($S_3$) following the acquiring of $S_2$ using the MRI system and acquiring a fourth image signal block ($S_4$) following the acquiring of $S_3$ using the MRI system, wherein the generating the calculated image data is based on an inner product normalization image combination of $S_1$ and $S_3$ wherein the calculated image data is R %, and wherein $R_3n$ is calculated based on the following:

$$R_{3/1} = \text{real}\left(\frac{S_3^* S_1}{|S_3|^2 + |S_1|^2}\right),$$

and/or
wherein the generating the calculated image data is based on an IPN image combination of $(S_3+S_4)$ and $S_1$ wherein the calculated image data is $R_{(3+4)/1}$, and wherein $R_{(3+4)/1}$ is calculated based on the following:

$$R_{(3+4)/1} = \text{real}\left(\frac{(S_3+S_4)*S_1}{|S_3+S_4|^2 + |S_1|^2}\right).$$

* * * * *

UNITED STATES PATENT AND TRADEMARK OFFICE
CERTIFICATE OF CORRECTION

PATENT NO. : 11,280,866 B2
APPLICATION NO. : 15/734337
DATED : March 22, 2022
INVENTOR(S) : Jullie W. Pan, Chan-Hong Moon and Hoby Hetherington It is certified that error appears in the above-identified patent and that said Letters Patent is hereby corrected as shown below:

In the Claims

Column 15, Line 3, "R %" should read --R 3/1--

Column 15, Line 4, "R3n" should read --R 3/1--

Signed and Sealed this
Twenty-fourth Day of May, 2022

Katherine Kelly Vidal
*Director of the United States Patent and Trademark Office*